United States Patent
Kronenberg et al.

(10) Patent No.: US 7,815,785 B2
(45) Date of Patent: Oct. 19, 2010

(54) DIRECT METALLIZATION OF ELECTRICALLY NON-CONDUCTIVE POLYIMIDE SUBSTRATE SURFACES

(75) Inventors: Walter Kronenberg, Köln (DE); Jürgen Hupe, Langenfeld (DE)

(73) Assignee: Enthone Inc., West Haven, CT (US)

( * ) Notice: Subject to any disclaimer, the term of this patent is extended or adjusted under 35 U.S.C. 154(b) by 582 days.

(21) Appl. No.: 11/756,048

(22) Filed: May 31, 2007

(65) Prior Publication Data

US 2007/0298170 A1    Dec. 27, 2007

(30) Foreign Application Priority Data

Jun. 22, 2006  (EP) .................. 06012849

(51) Int. Cl.
*C25D 5/34* (2006.01)
*C25D 5/54* (2006.01)
*C25D 5/56* (2006.01)

(52) U.S. Cl. .................. 205/159; 205/164; 205/210

(58) Field of Classification Search .......... 205/159, 205/164, 210
See application file for complete search history.

(56) References Cited

U.S. PATENT DOCUMENTS

| | | | |
|---|---|---|---|
| 3,099,608 A | 7/1963 | Radovsky et al. | |
| 4,336,100 A | 6/1982 | Passlick | |
| 4,560,593 A | 12/1985 | Naarmann et al. | |
| 4,976,990 A * | 12/1990 | Bach et al. | 427/97.2 |
| 5,194,313 A * | 3/1993 | Hupe et al. | 428/137 |
| 5,373,629 A | 12/1994 | Hupe et al. | |
| 5,770,032 A * | 6/1998 | Cane | 205/210 |
| 6,007,866 A | 12/1999 | Hupe et al. | |
| 6,589,593 B1 | 7/2003 | Hupe et al. | |

FOREIGN PATENT DOCUMENTS

| | | | |
|---|---|---|---|
| DE | 1299740 | | 7/1969 |
| DE | 3304004 A1 | | 8/1984 |
| DE | 4205190 A1 | | 8/1993 |
| DE | 10220684 A1 | * | 11/2003 |
| GB | 2030007 A | | 3/1980 |
| WO | 02095091 A2 | | 11/2002 |
| WO | WO 02095091 A1 | * | 11/2002 |

OTHER PUBLICATIONS

Abstract of DE3304004; Aug. 9, 1984.
Abstract of DE3806884; Sep. 21, 1989.
Abstract of DE4205190; Aug. 26, 1993.
Abstract of DE 10220684; Nov. 20, 2003.

* cited by examiner

*Primary Examiner*—Edna Wong
(74) *Attorney, Agent, or Firm*—Senniger Powers LLP

(57) ABSTRACT

The present invention relates to an improved method for the direct metallization of non-conductive substrate surfaces, in particular polyimide surfaces, that is characterized by the process steps of etching the substrate surface with an acidic etching solution that contains peroxide; contacting the etched substrate surface with an acidic treatment solution that contains permanganate; activating the treated substrate surface in an acidic activation solution that contains peroxide; contacting the activated substrate surface with an acidic catalytic solution that contains at least a thiophene derivate and at least a sulfonic acid derivate; metallization of the thus treated substrate surface in an acidic galvanic metallization bath.

19 Claims, No Drawings

DIRECT METALLIZATION OF ELECTRICALLY NON-CONDUCTIVE POLYIMIDE SUBSTRATE SURFACES

CROSS REFERENCE TO RELATED APPLICATION

This application claims priority from European application 06012849.3, the entire disclosure of which is incorporated by reference.

FIELD OF THE INVENTION

The present invention relates to an improved method for the direct metallization of electrically non-conductive substrate surfaces.

BACKGROUND OF THE INVENTION

The direct metallization of electrically non-conductive substrates plays an important role in modern manufacturing processes of printed circuits boards. Usually, printed circuits boards are made of glass fiber reinforced epoxy resins, polyimides, or other suitable polymeric plastics. Such printed boards are often manufactured as multilayer circuits, in which different conduction pattern layers are superimposed. Individual conduction layers are connected to each other by plated through holes. Both for the application of the conduction patterns by means of masks or other suitable methods and for the generation of a sufficient conductivity within the plated through holes, chemical copper deposition methods and direct metallization methods are conventionally used.

Besides these applications, the direct metallization of plastics is also used in the field of decorative coatings, such as for example in the field of fittings manufacture, manufacture of jewelry, or in the automotive industry.

In the state of the art, it is conventional to directly coat non-conductive plastic substrates by electrolytic plating. Such a method is, for example, described in U.S. Pat. No. 3,099,608 and DE 33 04 004. However, the methods described therein have not been used in practice, since only freshly prepared solutions could obtain relatively usable results. Shortly after initiation, the quality of the metal deposition decreased, such that only insufficient results were achieved.

German published specifications DE 1 299 740, DE 2 926 335 A1, and DE 31 32 218 A1 disclose methods for the manufacture of plated through holes of printed circuits using conductive lacquers with subsequent electrolytic or electroless metallization.

German patent DE 38 06 884 C1 disclosed a method for the manufacture of throughplated printed boards on the basis of a polymeric or ceramic substrate by electrolytic or electroless application of a metal layer onto the surfaces. The substrate is pre-treated in an oxidizing bath, removed from the bath, and rinsed to remove bath residues. The substrate is then introduced into a bath which contains a monomer, in particular pyrrole or pyrrole derivates, that is electrically conducting in polymeric form. The thus treated substrate is introduced into an acid bath, wherein an electrically conducting layer of polymerized pyrrole or pyrrole derivatives is formed, followed by rinsing to remove bath residues, and electrolytic metallization.

SUMMARY OF THE INVENTION

Among the objects of the present invention may be noted the provision of an improved method for the direct metallization of non-conductive substrate surfaces, in particular polyimide surfaces.

This aim is achieved by a method for the direct metallization of a non-conductive substrate surface. the method comprises the following steps in order: (1) etching the substrate surface with an acidic etchant solution comprising a peroxide; (2) contacting the etched substrate surface with an acidic treatment solution comprising a permanganate; (3) activating the treated substrate surface in an acidic activation solution comprising a peroxide; (4) contacting the activated substrate surface with an acidic catalytic solution comprising a thiophene derivative and a sulfonic acid derivative; and (5) metallizing the thus treated substrate surface in an acidic electrolytic metallization bath.

Such method for the direct metallization of non-conducting substrate surfaces improves the state of the art in that a reliable direct metallization of non-conductive substrate surfaces under clearly more economic and more ecologic process conditions becomes possible.

Such a process sequence in particular permits the use of smaller quantities of chemicals in the individual treatment solutions, which leads to a reduced environmental load.

Furthermore, in comparison to the state of the art, the process sequence according to the invention permits the use of solutions with reduced treatment temperatures. Hereby, additional economic and ecologic advantages can be obtained.

DETAILED DESCRIPTION OF VARIOUS EMBODIMENTS

The present invention is directed to a method of treating a non-conductive substrate to render it susceptible to metallization by electrolytic plating. The method comprises the following steps in order: (1) etching the substrate surface with an acidic etching solution that contains a peroxide; (2) contacting the etched substrate surface with an acidic treatment solution that contains permanganate; (3) activating the treated substrate surface in an acidic activation solution that contains an oxidizing agent; (4) contacting the activated substrate surface with an acidic treatment solution that contains at least a thiophene derivative and at least a sulfonic acid or a sulfonic acid derivative; and (5) metallizing the thus treated substrate surface in an acidic electrolytic metallization bath.

Substrates that may be treated and metallized according to the above generally described method include non-conductive substrates commonly used in PCB manufacture, in the manufacture of metallized fittings, and in the manufacture of metallized automotive parts. These substrates typically comprise plastics such as hard plastic substrates, as well as non-plastic insulators such as ceramics, glass, and rubber. Substrates that may be used in the process of the present invention may comprise polyimide, acrylonitrile butadiene styrene (ABS), a blend of ABS and polycarbonate (ABS/PC), polypropylene (PP), polyetheretherketones (PEEK), polyamide (PA), acrylonitrile styrene acrylate (ASA), and styrene acrylonitrile (SAN). A preferred substrate material is polyimide.

Appropriate substrate materials for printed circuit boards include, for example, fiber reinforced epoxy resin substrates (i.e., layers of fibrous materials bonded together under heat and pressure with a thermosetting resin). In general, an epoxy resin substrate comprises a continuous-filament glass cloth bonded with an epoxy-resin system. Specific examples of epoxy resin substrates include the following: G-10, which is a substrate comprising epoxy resin reinforced with glass fiber cloth sheets; FR-4, which is a self-extinguishing substrate similar to G-10; G-11, which is a glass cloth and epoxy mixture; and FR-5, which is a flame-resistant version of G-11. FR-4 substrates can be reinforced with ceramic particles, such as those available from Rogers Corporation (Chandler, Ariz.). Other resins include polyphenylene ether, cyanate ester, and bismaleimide/triazine. Additional dielectric materials which can be substrates for metallization include ceramics, glass, Teflon, glass fiber-reinforced Teflon, ceramic-reinforced Teflon, polystyrene, and polyimide (for flexible board applications). In a preferred embodiment, the substrate is polyimide.

In one embodiment of the method of the present invention, the substrate is contacted with an etchant solution for cleaning and micro-roughening of the surface. In one embodiment, the substrate is contacted with an etchant solution comprising a peroxide, and in another embodiment it contains a peroxide and an acid. The peroxide may be selected from among peroxysulfuric acid (Caro's acid), hydrogen peroxide, peroxydisulfuric acid, and salts thereof. The acid may be selected from among sulfuric acid, methane sulfonic acid, methane disulfonic acid, phenolsulfuric acid, and phosphoric acid. The acid may be a combination of acids selected from among sulfuric acid, methane sulfonic acid, methane disulfonic acid, phenolsulfuric acid, and phosphoric acid. In contrast to certain prior art processes, the etching temperature can be room temperature, advantageously permitting the omission of supplementary heating devices and associated energy costs related thereto can be omitted.

In one embodiment, the etchant solution comprises peroxydisulfuric acid or a salt thereof, such as sodium peroxydisulfate or ammonium peroxydisulfate. In this embodiment, the concentration of the peroxydisulfuric acid or the salt thereof is between about 30 g/L and about 120 g/L, preferably between about 80 g/L and about 120 g/L. In this embodiment, the etchant solution may also comprise an acid, which may be present in a concentration between about 10 g/L and about 200 g/L, preferably between about 30 g/L and about 100 g/L.

In an alternative embodiment, the etchant solution comprises peroxysulfuric acid (Caro's acid) or a salt thereof, such as sodium peroxysulfate (caroate) or ammonium peroxysulfate (caroate). In this embodiment, the concentration of the peroxysulfuric acid (Caro's acid) or the salt thereof is between about 30 g/L and about 120 g/L, preferably between about 80 g/L and about 120 g/L. In this embodiment, the etchant solution may also comprise an acid, which may be present in a concentration between about 10 g/L and about 200 g/L, preferably between about 30 g/L and about 100 g/L.

In another alternative embodiment, the etchant solution comprises hydrogen peroxide and sulfuric acid. In this embodiment, the concentration of the hydrogen peroxide is between about 50 mL/L and about 100 mL/L, preferably between about 60 mL/L and about 80 mL/L. In this embodiment, the concentration of the sulfuric acid is between about 10 g/L and about 200 g/L, preferably between about 30 g/L and about 100 g/L.

Prior to treatment in the acid permanganate solution, the substrate may optionally be conditioned in a commercially available conditioner, such as ENVISION® conditioners 7010, 7015, 7310, 7311, available from Enthone Inc. (West Haven, Conn.) wherein conditioning is carried out according to manufacturer's instructions. This treatment is an adsorption process which functionalizes the surface with N-containing groups.

After etching, the substrate is contacted with an acidic treatment solution containing permanganate. Contact with this solution causes "oxidative" activation of the substrate resin, in which the permanganate oxidizes the substrate, forming manganese dioxide on the substrate surface. Manganese dioxide ($MnO_2$) acts as the oxidizing agent during the oxidative polymerization of the thiophene derivative (applied in a later step) to form the electrically conductive polythiophene polymer derivative on the surface of the substrate. In one preferred embodiment, this solution comprises between about 30 g/L and 60 g/L permanganate in the form of potassium or sodium permanganate. The acid is selected from among hydrochloric acid, sulfuric acid, phosphoric acid, methane sulfonic acid, and methane disulfonic acid. The acid may comprise a combination of acids selected from among hydrochloric acid, sulfuric acid, phosphoric acid, methane sulfonic acid, and methane disulfonic acid. The acid is added in sufficient concentration to achieve the desired pH, which may be less than about pH 5 in one embodiment, preferably less than about pH 3, and more preferably about pH 2. The temperature during contacting the etched substrate surfaces with the permanganate containing treatment solution can be between 40° C. and 70° C., preferably between 50° C. and 60° C.

After treatment in the acid permanganate solution, the substrate surface is activated in an activator solution. The composition of this activator solution may be the same as the above-described etchant solution. Accordingly, the substrate is contacted with an activator solution comprising a peroxide. In one embodiment, the substrate is contacted with an activator solution comprising a peroxide and an acid. The peroxide may be selected from among peroxysulfuric acid (Caro's acid), hydrogen peroxide, peroxydisulfuric acid, and salts thereof. The acid may be selected from among sulfuric acid, methane sulfonic acid, methane disulfonic acid, phenolsulfuric acid, and phosphoric acid. The acid may be a combination of acids selected from among sulfuric acid, methane sulfonic acid, methane disulfonic acid, phenolsulfuric acid, and phosphoric acid. In one preferred embodiment, activation in the activator solution is carried out with help of ultrasonic agitation, for example, by placement of an ultrasonic generator in the activation bath.

In one embodiment, the activator solution comprises peroxydisulfuric acid or a salt thereof, such as sodium peroxydisulfate or ammonium peroxydisulfate. In this embodiment, the concentration of the peroxydisulfuric acid or the salt thereof is between about 30 g/L and about 120 g/L, preferably between about 80 g/L and about 120 g/L. In this embodiment, the activator solution may also comprise an acid, which may be present in a concentration between about 10 g/L and about 200 g/L, preferably between about 30 g/L and about 100 g/L.

In an alternative embodiment, the activator solution comprises peroxysulfuric acid (Caro's acid) or a salt thereof, such as sodium peroxysulfate (caroate) or ammonium peroxysulfate (caroate). In this embodiment, the concentration of the peroxysulfuric acid (Caro's acid) or the salt thereof is between about 30 g/L and about 120 g/L, preferably between about 80 g/L and about 120 g/L. In this embodiment, the activator solution may also comprise an acid, which may be present in a concentration between about 10 g/L and about 200 g/L, preferably between about 30 g/L and about 100 g/L.

In another alternative embodiment, the activator solution comprises hydrogen peroxide and sulfuric acid. In this embodiment, the concentration of the hydrogen peroxide is between about 50 mL/L and about 100 mL/L, preferably between about 60 mL/L and about 80 mL/L. In this embodiment, the concentration of the sulfuric acid is between about 10 g/L and about 200 g/L, preferably between about 30 g/L and about 100 g/L.

Following activation, the substrate is contacted with a catalytic solution comprising a thiophene derivative. In one embodiment, the catalytic solution additionally comprises a sulfonic acid or a sulfonic acid derivative. In one embodiment, the catalytic solution comprises a 3,4-alkylenedioxythiophene as the thiophene derivative. In one preferred embodiment, the catalytic solution comprises 3,4-ethylenedioxythiophene as the thiophene derivative and polystyrene sulfonic acid as the sulfonic acid derivative. The catalytic solution may additionally comprise an acid to adjust the pH to within a range between about 1 and about 3, such as about 2. In one embodiment, the acid used for pH adjustment is phosphoric acid.

In one preferred embodiment, the concentration of 3,4-ethylenedioxythiophene may be between about 7 mL/L and about 20 mL/L, preferably between about 7 mL/L and about 13 mL/L, such as between about 7 mL/L and about 10 mL/L. In this embodiment, the concentration of polystyrene sulfonic acid may be between about 7 mL/L and about 30 mL/L, preferably between about 7 mL/L and about 13 mL/L, such as between about 10 mL/L and about 13 mL/L. The catalytic solution used may be one that is commercially available, such as ENVISION® Catalytic Solutions 7350A and 7350B, available from Enthone Inc. (West Haven, Conn.) wherein the exposure is carried out according to manufacturer's instructions. As noted above, treatment with the permanganate solution enriches the substrate surface with manganese dioxide, which serves as a catalyst for the polymerization of 3,4-ethylenedioxythiophene. The thiophene polymer present on the surface of the substrate is electrically conductive, thereby rendering the non-conductive surface conductive and susceptible to electrolytic plating.

The thus treated substrate surfaces are subsequently metallized in an appropriate electrolyte for the electrolytic deposition of a metal layer. Various metals and alloys may be deposited on the treated substrates by electrolytic plating. However, it is preferred to use copper electrolytes, particularly in the context of metallizing plate through holes in PCB manufacture; or nickel electrolytes, or a combination of Cu and Ni. Particularly preferred are copper electrolyte solutions comprising sulfuric acid which have a content of from 50 to 300 g/L of free sulfuric acid and a metal content of from 5 to 50 g/L. However, electrolytes containing fluoroboric acid, hydrochloric acid, thiosulfate, or pyrophosphate or cyanidic electrolytes as well as electrolytes based on sulfamines and organic sulfonic acids have proven to be suitable. The electrolytic deposition is effected under the conventional conditions, namely between 20° C. and 70° C. with current densities of between 0.1 A/dm$^2$ to 20 A/dm$^2$. The plating duration required for the electrodeposition may be between about 2 and about 5 minutes. The metal layers obtained are uniform, continuous and, in addition, firmly adhering, which also do not show any defective spots in the so-called through-light test. An applicable commercially available composition for electrolytic deposition of copper is CUPROSTAR® LP1 available from Enthone Inc. (West Haven, Conn.), wherein deposition is carried out according to manufacturer's instructions.

In another embodiment of the method according to the invention, the treated substrate surface can be rinsed in an acid rinsing solution, preferably in a sulfuric acid rinsing solution, before electrolytically coating with a metallic layer.

It is within the scope of the invention that rinsing steps are carried out between each of the foregoing individual treatment steps. The rinse water may be distilled water, but tap water is also applicable. The temperature of the rinse water may be between room temperature to about 30° C.

It is a special advantage of the method according to the invention that, with the exception of the step of contacting the substrate surface with an acid permanganate-containing treatment solution, all process steps can be carried out at room temperature (between about 20 and about 25 C). This is in particular a reason why significant advantages can be achieved in comparison to the methods known from the state of the art, since additional devices for heating and maintaining temperature of the process solutions can be omitted, and energy for heating and maintaining temperature need not be expended.

The treatment times of the individual process steps, with the exception of the electrolytic metallization, are typically in a range between about 60 seconds and about 180 seconds. The activation solution step can even be carried out in less than about 60 seconds. And the optional step of contacting the treated substrate surface with an acidic, preferably sulfuric acid containing, rinsing solution before electrolytic metallization can also be performed in less than about 60 seconds.

The following examples further illustrate the method according to the invention.

EXAMPLE NO. 1

A polyimide substrate having the size of 600 mm×500 mm was metallized according to the following protocol:

Etching: 3 min. etching in an etchant solution comprising sodium peroxydisulfate (100 g/L) and sulfuric acid (50 g/L) at room temperature.

Rinsing.

Conditioning: 3 min. conditioning in a commercial conditioner (40 mL/L Envision 7015) at a temperature between about 25° C. and about 40° C.

Rinsing.

Treating in permanganate solution: 3 min. activating in permanganate containing acid solution comprising potassium permanganate (50 g/L) and sufficient methane sulfonic acid for setting the pH value to 2.0±0.1, at 50° C.

Rinsing.

Activating: activating the substrate surface with an activator solution comprising sodium peroxydisulfate (100 g/L) and sulfuric acid (50 g/L) supported by ultrasonic agitation at room temperature.

Rinsing.

Catalyzing: 2-3 min. contacting the activated surfaces with a catalytic solution comprising 3,4-ethylenedioxythiophene (10 mL/L), styrene sulfonic acid (10 mL/L), and a phosphoric acid solution (about 2 mL/L) for setting the pH value to 2.0±0.1 at room temperature.

Rinsing.

Etching.

Metallizing: with Envision CUPROSTAR® LP1 available from Enthone Inc. (West Haven, Conn.) according to the instructions provided by the manufacturer.

EXAMPLE NO. 2

A polyimide substrate having the size of 600 mm×500 mm was metallized according to the following protocol:

Etching: 3 min. etching in an etchant solution comprising sodium peroxydisulfate (80 g/L) and sulfuric acid (50 g/L) at room temperature.
Rinsing.
Conditioning: 3 min. conditioning in a commercial conditioner (40 mL/L Envision 7015) at between room temperature and 40° C.
Rinsing.
Treating with permanganate solution: 3 min. activating in permanganate containing acid solution comprising potassium permanganate (40 g/L) and sufficient methane sulfonic acid for setting the pH value to 2.0±0.1 at 50° C.
Rinsing.
Activating: activating the substrate surface with an activator solution comprising sodium peroxysulfate (80 g/L, caroate) and sulfuric acid (50 g/L) supported by ultrasonic agitation at room temperature.
Rinsing.
Catalyzing: 2-3 min. contacting the activated surfaces with a catalytic solution comprising 3,4-ethylenedioxythiophene (7 mL/L), styrene sulfonic acid (7 mL/L), and a phosphoric acid solution (about 2 mL/L) for setting the pH value to 2.0±0.1 at room temperature.
Rinsing.
Etching.
Metallizing: with Envision CUPROSTAR® LP1 available from Enthone Inc. (West Haven, Conn.) according to the instructions provided by the manufacturer.

EXAMPLE NO. 3

A polyimide substrate having the size of 600 mm×500 mm was metallized according to the following protocol:
Etching: 3 min. etching with an etchant solution comprising hydrogen peroxide (80 mL/L, 33%), sulfuric acid (50 g/L), and phenolsulfonic acid (10 mL/L) at room temperature.
Rinsing.
Conditioning: 3 min. conditioning in a commercial conditioner (40 mL/L Envision 7015) at between about room temperature and 40° C.
Rinsing.
Treating with permanganate solution: 3 min. activating in permanganate containing acid solution comprising sodium permanganate (36 g/L) and sufficient methane sulfonic acid for setting the pH value to 2.0±0.1 at 50° C.
Rinsing.
Activating: activating the substrate surface with an activating solution comprising sodium peroxydisulfate (100 g/L) and sulfuric acid (50 g/L) supported by ultrasonic agitation at room temperature.
Rinsing.
Catalyzing: 2-3 min. contacting the activated surfaces with a catalytic solution comprising 3,4-ethylenedioxythiophene (10 mL/L), styrene sulfonic acid (10 mL/L), and phosphoric acid containing solution (about 2 mL/L) for setting the pH value to 2.0±0.1 at room temperature.
Rinsing.
Etching.
Metallizing: with Envision CUPROSTAR® LP1 available from Enthone Inc. (West Haven, Conn.) according to the instructions provided by the manufacturer.

EXAMPLE NO. 4

A polyimide substrate having the size of 600 mm×500 mm was metallized according to the following protocol:

Etching: 3 min. etching in an etchant solution comprising sodium peroxydisulfate (100 g/L) and sulfuric acid (50 g/L) at room temperature.
Rinsing.
Conditioning: 3 min. conditioning in a commercial conditioner (40 mL/L Envision 7015) at a temperature between about room temperature up to 40° C.
Rinsing.
Treating with permanganate solution: 3 min. activating in permanganate containing acid solution comprising potassium permanganate (50 g/L) and sufficient methane sulfonic acid for setting the pH value to 2.0±0.1 at 50° C.
Rinsing.
Activating: activating the substrate surface with an activator solution comprising sodium peroxydisulfate (30 g/L) and sulfuric acid (50 g/L) supported by ultrasonic agitation at room temperature.
Rinsing.
Catalyzing: 2-3 min. contacting the activated surfaces with a catalytic solution comprising 3,4-ethylenedioxythiophene (10 mL/L), styrene sulfonic acid (10 mL/L), and a phosphoric acid solution (about 2 mL/L) for setting the pH value to 2.0±0.1 at room temperature.
Rinsing.
Etching.
Metallizing: with Envision CUPROSTAR® LP1 available from Enthone Inc. (West Haven, Conn.) according to the instructions provided by the manufacturer.

EXAMPLE NO. 5

A polyimide substrate having the size of 600 mm×500 mm was metallized according to the following protocol:
Etching: 3 min. etching in an etchant solution comprising sodium peroxydisulfate (80 g/L) and sulfuric acid (50 g/L) at room temperature.
Rinsing.
Conditioning: 3 min. conditioning in a commercial conditioner (40 mL/L Envision 7015) at between about room temperature up to 40° C.
Rinsing.
Treating with permanganate solution: 3 min. activating in permanganate containing acid solution comprising potassium permanganate (40 g/L) and sufficient methane sulfonic acid for setting the pH value to 2.0±0.1 at 50° C.
Rinsing.
Activating: activating the substrate surface in an activator solution comprising sodium peroxysulfate (40 g/L, caroate) and sulfuric acid (50 g/L) supported by ultrasonic agitation at room temperature.
Rinsing.
Catalyzing: 2-3 min. contacting the activated surfaces with a catalytic solution comprising 3,4-ethylenedioxythiophene (7 mL/L), styrene sulfonic acid (7 mL/L), and a phosphoric acid solution (about 2 mL/L) for setting the pH value to 2.0±0.1 at room temperature.
Rinsing.
Etching.
Metallizing: with Envision CUPROSTAR® LP1 available from Enthone Inc. (West Haven, Conn.) according to the instructions provided by the manufacturer.

EXAMPLE NO. 6

A polyimide substrate having the size of 600 mm×500 mm was metallized according to the following protocol:

Etching: 3 min. etching in an etchant solution comprising hydrogen peroxide (33%, 80 mL/L), sulfuric acid (50 g/L), and phenolsulfonic acid solution (10 mL/L) at room temperature.

Rinsing.

Conditioning: 3 min. conditioning in a commercial conditioner (40 mL/L Envision 7015) at between about room temperature up to 40° C.

Rinsing.

Treating with permanganate solution: 3 min. activating in permanganate containing acid solution comprising sodium permanganate (36 g/L) and sufficient methane sulfonic acid for setting the pH value to 2.0±0.1 at 50° C.

Rinsing.

Activating: activating the substrate surface in an activator solution comprising sodium peroxydisulfate (40 g/L) and sulfuric acid (50 g/L) supported by ultrasonic agitation at room temperature.

Rinsing.

Catalyzing: 2-3 min. contacting the activated surfaces with a catalytic solution comprising 3,4-ethylenedioxythiophene (10 mL/L), styrene sulfonic acid (10 mL/L), and a phosphoric acid solution (about 2 mL/L) for setting the pH value to 2.0±0.1 at room temperature.

Rinsing.

Etching.

Metallizing: with Envision CUPROSTAR® LP1 available from Enthone Inc. (West Haven, Conn.) according to the instructions provided by the manufacturer.

Alternatively, all methods according to the invention indicated in the examples 1 through 6 were carried out with Teflon substrates that had been pre-treated with FR 4 and plasma.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained. As various changes could be made in the above compositions and processes without departing from the scope of the invention, it is intended that all matter contained in the above description shall be interpreted as illustrative and not in a limiting sense.

What is claimed is:

1. A method for the direct metallization of a non-conductive substrate surface, the method comprising the following steps in order:
   (1) etching the substrate surface with an acidic etchant solution comprising a first peroxide;
   (2) contacting the etched substrate surface with an acidic treatment solution comprising a permanganate which contact yields a treated substrate surface comprising manganese dioxide thereon;
   (3) activating the treated substrate surface in an acidic activator solution comprising a second peroxide;
   (4) contacting the activated substrate surface with an acidic catalytic solution comprising a thiophene derivative and a sulfonic acid derivative wherein the manganese dioxide on the substrate surface catalyzes the polymerization of the thiophene derivative into a thiophene polymer; and
   (5) metallizing by electrolytic plating the thus treated substrate surface in an acidic electrolytic metallization bath.

2. A method according to claim 1, wherein the non-conductive substrate surface is a polyimide surface.

3. A method according to claim 1, further comprising rinsing the substrate surface between the individual method steps.

4. A method according to claim 1, wherein the first peroxide is present in the etchant solution in a concentration between about 30 g/L and about 120 g/L, and the etchant solution further comprises an acid selected from the group consisting of sulfuric acid, methane sulfonic acid, methane disulfonic acid, phenolsulfuric acid, phosphoric acid, and combinations thereof.

5. A method according to claim 1, wherein the first peroxide is present in the etchant solution in a concentration between about 80 g/L to about 120 g/L, and the etchant solution further comprises an acid selected from the group consisting of sulfuric acid, methane sulfonic acid, methane disulfonic acid, phenolsulfuric acid, phosphoric acid, and combinations thereof.

6. A method according to claim 1, wherein the permanganate is present in the acidic treatment solution in a concentration between about 30 g/L and about 60 g/L, and the acidic treatment solution further comprises an acid selected from the group consisting of hydrochloric acid, sulfuric acid, phosphoric acid, methane sulfonic acid, methane disulfonic acid, and combinations thereof.

7. A method according to claim 6, wherein the acidic treatment solution has a pH of less than about pH 5.

8. A method according to claim 7, wherein the pH is less than about pH 3.

9. A method according to claim 7, wherein the pH is about pH 2.

10. A method according to claim 1, wherein the second peroxide is present in the activator solution in a concentration between about 30 g/L and about 120 g/L, and the activator solution further comprises an acid selected from the group consisting of sulfuric acid, methane sulfonic acid, methane disulfonic acid, phenolsulfuric acid, phosphoric acid, and combinations thereof.

11. A method according to claim 1, wherein the second peroxide is present in the activator solution in a concentration between about 80 g/L to about 120 g/L, and the activator solution further comprises an acid selected from the group consisting of sulfuric acid, methane sulfonic acid, methane disulfonic acid, phenolsulfuric acid, phosphoric acid, and combinations thereof.

12. A method according to claim 10, wherein the activator solution is identical to the etchant solution with respect to the composition thereof.

13. A method according to claim 1, wherein the activation is carried out with ultrasonic agitation.

14. A method according to claim 1, wherein the thiophene derivative comprises a 3,4-alkylenedioxythiophene and the sulfonic acid derivative comprises styrene sulfonic acid.

15. A method according to claim 1, wherein after the treatment with the acidic catalytic solution, the substrate surface is contacted with an acidic rinsing solution.

16. A method according to claim 1, wherein the acidic electrolytic metallization bath comprises an acidic electrolytic copper metallization bath.

17. A method for the direct metallization of a non-conductive polyimide-based substrate surface, the method comprising the following steps in order:
   (1) etching the substrate surface at a temperature between about 20 and about 25° C. with an acidic etchant solution comprising a first peroxide;

(2) contacting the etched substrate surface with an acidic treatment solution comprising a permanganate which contact yields a treated substrate surface comprising manganese dioxide thereon;

(3) activating the treated substrate surface at a temperature between about 20 and about 25° C. in an acidic activator solution comprising a second peroxide;

(4) contacting the activated substrate surface with an acidic catalytic solution comprising 3,4-ethylenedioxythiophene and styrene sulfonic acid at a temperature between about 20 and about 25° C. wherein the manganese dioxide on the substrate surface catalyzes the polymerization of the 3,4-ethylenedioxythiophene into a thiophene polymer; and (5) metallizing by electrolytic plating the thus treated substrate surface in an acidic electrolytic metallization bath.

18. The method of claim 17 wherein the first peroxide in step 1 is a peroxysulfuric acid or salt thereof in a concentration between about 30 g/L and about 120 g/L and the second peroxide in step (3) is a peroxysulfuric acid or salt thereof in a concentration between about 30 g/L and about 120 g/L.

19. A method for the direct metallization of a non-conductive polyimide-based substrate surface, the method comprising the following steps in order:

(1) etching the substrate surface at a temperature between about 20 and about 25° C. with an acidic etchant solution comprising between about 30 g/L and about 120 g/L peroxysulfuric acid or salt thereof, and the etchant solution further comprises an acid selected from the group consisting of sulfuric acid, methane sulfonic acid, methane disulfonic acid, phenolsulfuric acid, phosphoric acid, and combinations thereof;

(2) contacting the etched substrate surface with an acidic treatment solution comprising a permanganate which contact yields a treated substrate surface comprising manganese dioxide thereon;

(3) activating the treated substrate surface at a temperature between about 20 and about 25° C. in an acidic activator solution comprising between about 30 g/L and about 120 g/L peroxysulfuric acid or salt thereof, and the activator solution further comprises an acid selected from the group consisting of sulfuric acid, methane sulfonic acid, methane disulfonic acid, phenolsulfuric acid, phosphoric acid, and combinations thereof;

(4) contacting the activated substrate surface with an acidic catalytic solution comprising 3,4-ethylenedioxythiophene and styrene sulfonic acid at a temperature between about 20 and about 25° C. wherein the manganese dioxide on the substrate surface catalyzes the polymerization of the 3,4-ethylenedioxythiophene into a thiophene polymer; and (5) metallizing by electrolytic plating the thus treated substrate surface in an acidic electrolytic metallization bath.

* * * * *